(12) United States Patent
Rodenbeck et al.

(10) Patent No.: US 7,408,512 B1
(45) Date of Patent: Aug. 5, 2008

(54) ANTENNA WITH DISTRIBUTED STRIP AND INTEGRATED ELECTRONIC COMPONENTS

(75) Inventors: Christopher T. Rodenbeck, Albuquerque, NM (US); Jason A. Payne, Albuquerque, NM (US); Cory W. Ottesen, Albuquerque, NM (US)

(73) Assignee: Sandie Corporation, Albuquerque, MN (US)

( * ) Notice: Subject to any disclaimer, the term of this patent is extended or adjusted under 35 U.S.C. 154(b) by 359 days.

(21) Appl. No.: 11/415,931

(22) Filed: May 2, 2006

Related U.S. Application Data

(63) Continuation-in-part of application No. 11/243,860, filed on Oct. 5, 2005, now Pat. No. 7,345,647.

(51) Int. Cl.
*H01Q 1/38* (2006.01)
(52) U.S. Cl. .............................. 343/700 MS
(58) Field of Classification Search ................. 343/895, 343/700 MS, 702, 767, 749, 830, 846
See application file for complete search history.

(56) References Cited

U.S. PATENT DOCUMENTS

| | | | |
|---|---|---|---|
| 4,903,326 A | | 2/1990 | Zakman et al. |
| 5,532,708 A | | 7/1996 | Krenz et al. |
| 5,703,932 A | | 12/1997 | Oda |
| 5,838,285 A | * | 11/1998 | Tay et al. .................... 343/895 |
| 5,936,587 A | * | 8/1999 | Gudilev et al. .............. 343/752 |
| 5,995,006 A | * | 11/1999 | Walsh ...................... 340/572.7 |
| 6,028,555 A | | 2/2000 | Harano |
| 6,045,652 A | | 4/2000 | Tuttle et al. |
| 6,166,694 A | * | 12/2000 | Ying .......................... 343/702 |
| 6,181,283 B1 | | 1/2001 | Johnson et al. |
| 6,252,550 B1 | * | 6/2001 | Vernon ................. 343/700 MS |
| 6,285,342 B1 | | 9/2001 | Brady et al. |
| 6,327,154 B1 | | 12/2001 | Gauld et al. |
| 6,388,626 B1 | * | 5/2002 | Gamalielsson et al. ....... 343/702 |
| 6,424,301 B1 | | 7/2002 | Johnson et al. |
| 6,504,508 B2 | * | 1/2003 | Apostolos ............ 343/700 MS |
| 6,535,166 B1 | | 3/2003 | Ali |
| 6,661,381 B2 | | 12/2003 | Chen |

(Continued)

OTHER PUBLICATIONS

"Using Text as a Meander Line for RFID Transponder Antennas", Mikko Keskilammi, et al., IEEE Antennas and Wireless Propagation Letters, pp. 372-374, vol. 3, 2004.

(Continued)

*Primary Examiner*—Huedung Cao Mancuso
(74) *Attorney, Agent, or Firm*—William R. Conley

(57) ABSTRACT

An antenna comprises electrical conductors arranged to form a radiating element including a folded line configuration and a distributed strip configuration, where the radiating element can be in proximity to a ground conductor and/or arranged as a dipole. Embodiments of the antenna include conductor patterns formed on a printed wiring board, having a ground plane, spacedly adjacent to and coplanar with the radiating element. An antenna can comprise a distributed strip patterned on a printed wiring board, integrated with electronic components mounted on top of or below the distributed strip, and substantially within the extents of the distributed strip. Mounting of electronic components on top of or below the distributed strip has little effect on the performance of the antenna, and allows for realizing the combination of the antenna and integrated components in a compact form. An embodiment of the invention comprises an antenna including a distributed strip, integrated with a battery mounted on the distributed strip.

24 Claims, 13 Drawing Sheets

U.S. PATENT DOCUMENTS

| | | | |
|---|---|---|---|
| 6,700,491 | B2 | 3/2004 | Shafer |
| 6,747,600 | B2 | 6/2004 | Wong et al. |
| 6,759,984 | B2 | 7/2004 | Wielsma |
| 6,801,169 | B1 | 10/2004 | Chang et al. |
| 6,842,148 | B2 * | 1/2005 | Hendler et al. ............... 343/702 |
| 6,853,335 | B1 | 2/2005 | Yeh |
| 6,856,285 | B2 | 2/2005 | Bettin et al. |
| 6,870,505 | B2 | 3/2005 | Aisenbrey |
| 6,871,079 | B1 | 3/2005 | Choi et al. |
| 2004/0150565 | A1 | 8/2004 | Paun |
| 2006/0017620 | A1 * | 1/2006 | Chen et al. ............ 343/700 MS |
| 2007/0085742 | A1 * | 4/2007 | Kikin .................. 343/700 MS |

OTHER PUBLICATIONS

"Gain-Optimized Self-Resonant meander Line Antennas for RFID Applications", Gaetano Marrocco, IEEE Antennas and Wireless Propagation Letters, pp. 302-305, vol. 2, 2003.

"Are Space-Filling Curves Efficient Small Antennas?", Jose M. Gonzalez-Arbesu, IEEE Antennas and Wireless Propagation Letters, pp. 147-150, vol. 2, 2003.

"A Planar Compact CPW-Fed Antenna", Proceedings of Asia-Pacific Microwave Conference, APMC2001, Dec. 3-6, 2001, pp. 934-937, vol. 2, 2001.

* cited by examiner

ND DISTRIBUTED STRIP AND
INTEGRATED ELECTRONIC COMPONENTS

ANTENNA WITH DISTRIBUTED STRIP AND INTEGRATED ELECTRONIC COMPONENTS

RELATED APPLICATIONS

This application is a continuation in part of U.S. application Ser. No. 11/243,860 filed on Oct. 5, 2005 now U.S. Pat. No. 7,345,647, Titled: "Antenna Structure with Distributed Strip".

STATEMENT REGARDING FEDERALLY SPONSORED RESEARCH OR DEVELOPMENT

The United States Government has certain rights in this invention pursuant to Department of Energy Contract No. DE-AC04-94AL85000 with Sandia Corporation.

FIELD OF THE INVENTION

The present invention relates to the design and construction of antennas that can be used to receive and/or transmit radio frequency signals. The present invention additionally relates to compact antennas having a distributed strip structure. The present invention further relates to compact antennas having a distributed strip and integrated electronic components, such as a battery.

BACKGROUND OF THE INVENTION

Wireless communication systems operating at radio frequencies and having antennas, are demanding ever smaller form factors, as for example, in the field of radio frequency identification (RFID). RFID allows users to identify, locate, track and exchange information with remote assets. Typically in RFID applications a wireless communication device containing data, and including an antenna and a microchip and/or a surface acoustic wave (SAW) device, is attached to the item to be identified or tracked while a "host" reads and/or writes information to the device through the use of radio frequency communication. Applications for this technology are rapidly expanding across a range of economic sectors that include manufacturing, retail, medical care, agriculture, transportation and environmental stewardship. In all these applications, compact low-profile RFID devices are highly valued, making reduced antenna size an area of great interest and endeavor.

Device size is an issue in wireless systems. Small devices are more easily sorted, transported and/or used. Typically, a compact or low-profile wireless device is more desirable, and sells at a higher price than an equivalent but larger device would. Unfortunately there are components that are found within all portable wireless devices that are not easily miniaturized, for example, batteries and antennas.

BRIEF DESCRIPTION OF THE DRAWINGS

The accompanying drawings, which are incorporated in and form part of the specification, illustrate several embodiments of the present invention and, together with the description, serve to explain the principles of the invention. The drawings provided herein are not drawn to scale.

DETAILED DESCRIPTION OF THE INVENTION

In the design of antennas to be incorporated into hand-held, portable or small devices to be affixed to objects such as in radio frequency identification (RFID) the small form factor of the devices can require the antenna to fit within a space that can be much less than a quarter of the operating wavelength of the device. For example, for devices operating in the wavelength range of λ=3 m to 0.15 cm (equivalent to an operational frequency range of 100 MHz to 200 GHz) the length of a ¼λ (monopole) antenna would lie between 75 cm and 0.04 cm, and the length of a ½λ (dipole) antenna would lie between 150 cm and 0.08 cm. As can readily be seen, ¼λ and ½λ antenna lengths are often much larger than the physical size of the device into which the antenna must fit. In an exemplary application such as an RFID device, functional limits on the size of an individual device can require an antenna to be very small, often less than 0.1λ in overall length.

The present invention provides antennas that can be designed to fit within the small form factors (less than ¼λ) often required of wireless systems, by incorporating a conductor arranged in a distributed strip configuration with a conductor arranged in a folded line configuration in the radiating element of the antenna. The present invention does not require the use of coplanar waveguide and/or a microstrip feeds to the antenna. Many advantages of the present invention will become apparent in the exemplary embodiments presented herein. The following described embodiments present several variations of the invention and therefore serve to illustrate, but not limit, the scope of the invention.

Figure 1A:
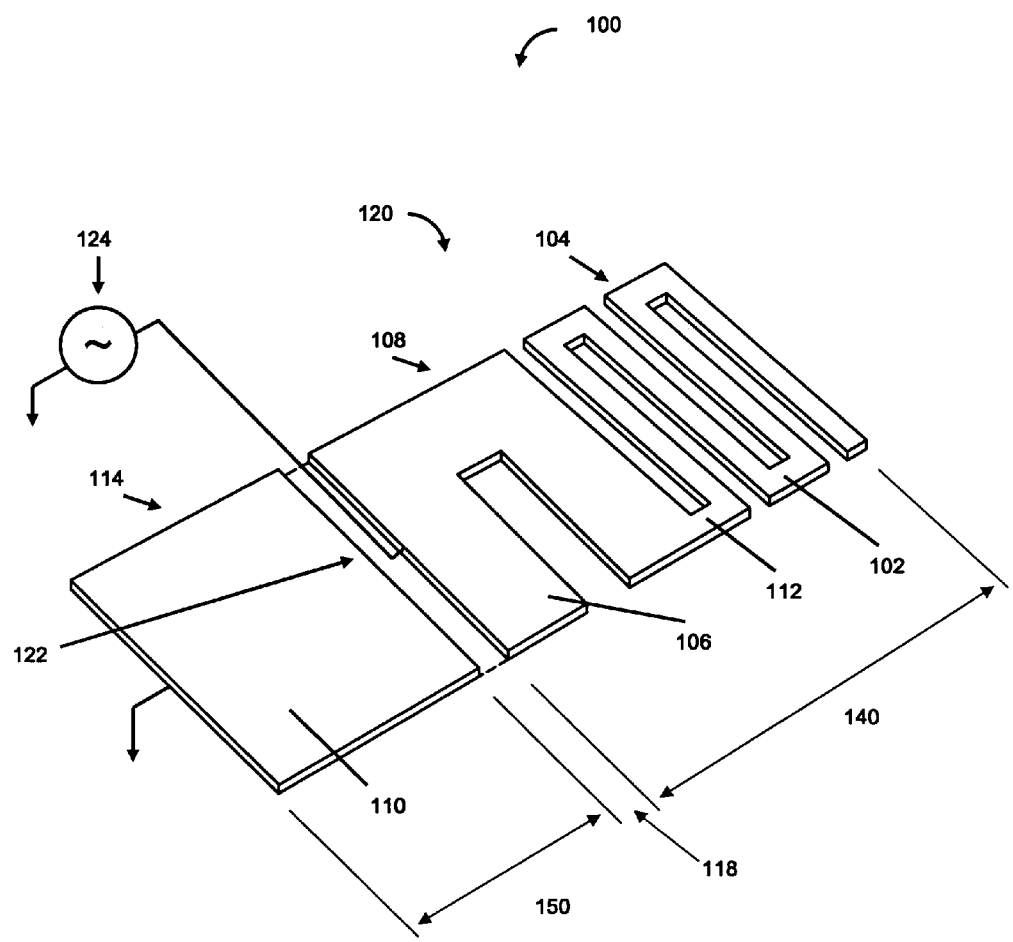
FIG. 1A is a schematic perspective view of an embodiment of an antenna according to the present invention.

FIG. 1A is a schematic perspective view of an embodiment of an antenna 100 according to the present invention. Antenna 100 comprises an electrical conductor 102 arranged in a folded line configuration 104 (e.g. a meander line) and an electrical conductor 106 arranged in a distributed strip configuration 108, and an electrical conductor 110 arranged as a ground plane 114. The electrical conductor 102 of the folded line configuration 104 is electrically connected to the electrical conductor 106 of the distributed strip configuration 108, for example at the connection 112. The radiating element 120 of the antenna 100 comprises the folded line configuration 104 and the distributed strip configuration 108. The radiating element 120 comprises at least two electrically connected conductors, having different line widths. The ground conductor 110 has no direct connection to either of the conductors 106 and 102, and is spaced from conductors 106 and 102 by a gap 118. The gap 118 can have a width as small as practically achievable in manufacturing the antenna, while the upper limit on the width of the gap is set by the requirement that the ground conductor 110 be electrically coupled, i.e. capacitively and/or inductively, but not directly connected to, the radiating element comprising conductors 102 and 106 of the antenna 100.

In the example embodiment, the electrical conductors 102, 106 and 110 are illustrated as comprising electrically conductive sheets or foils in free space, arranged to lie within a single plane. A signal feed 122 interconnecting the electronics 124 of a system to the antenna can be made at a location within the gap 118. In other embodiments as described below, the signal feed 122 can be interconnected to the radiating element 120 at virtually any other location along the conductors 106 and/or 102. The location of the signal feed 122 can be determined by convenience, for example by the relative orientation of the radiating element 120, to the location of the electronics 124 of a system. In this embodiment, the radiating element has a length 140, the ground a length of 150 and for convenience, the radiating element and the ground plane are illustrated as having equal widths.

Figure 1B:
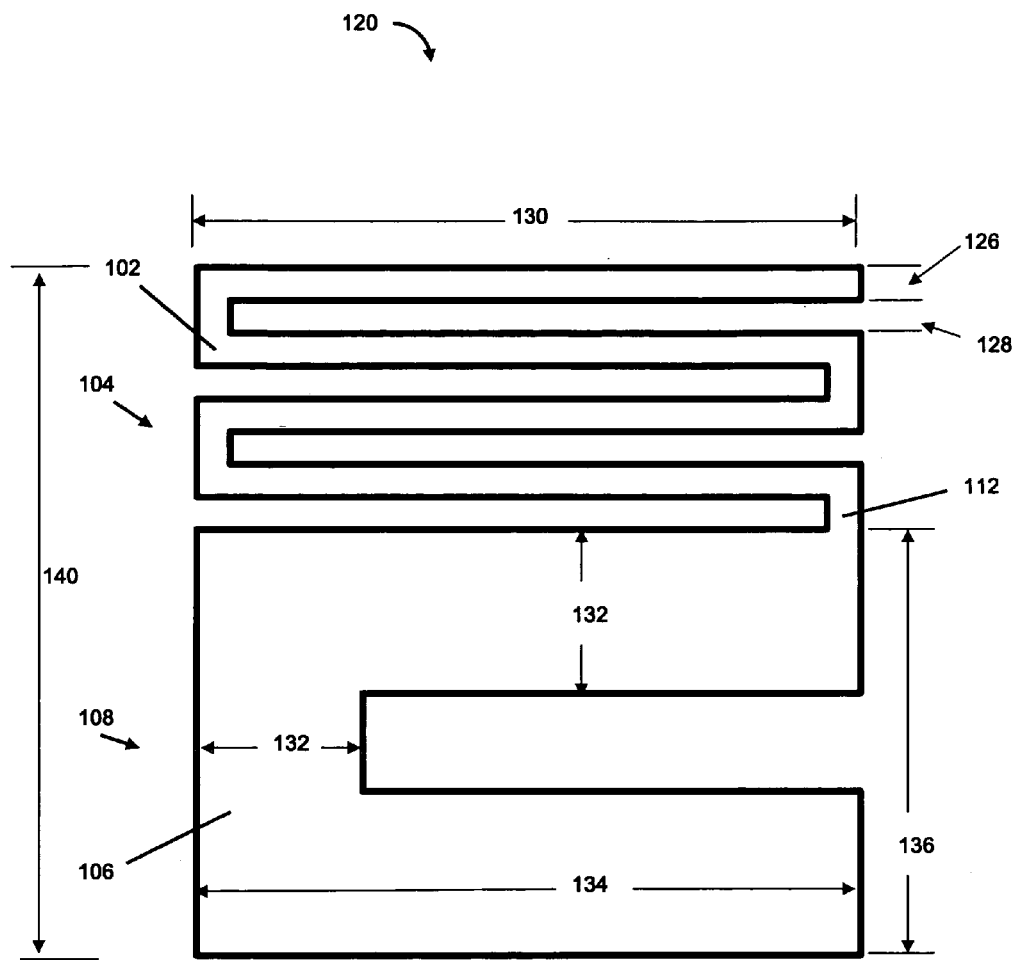
FIG. 1B is an enlarged schematic view of the radiating element of the antenna in FIG. 1A.

FIG. 1B is a enlarged scale schematic illustration of the radiating element 120 of the antenna 100 as shown in FIG. 1A. In this embodiment, the folded line configuration 104 has a width 130 and comprises two turns (N=2) of the conductor 102, wherein the conductor has a width 126 and adjacent legs of the turns are spaced by the distance 128. The number of turns is two for illustrative purposes only. Other embodiments can have many turns, for example N=11, eleven turns, as described below. The folded line configuration 104 comprises a conductor 102, for example a wire, metal trace or foil, that is repeatedly folded, in this example, in a two dimensional plane. The folding of the conductor 102 into a folded line configuration primarily adds inductive loading to the radiating element, and reduces the antenna's physical size in comparison with a conventional resonant dipole antenna. The folding of the conductor 102 maintains a long "running length", or electrical length, of the conductor within a compact area.

In FIG. 1B the distributed strip configuration 108 has a width 134, length 136, and comprises a conductor 106 having a width 132. The distributed strip configuration 108 primarily adds capacitance to the antenna, and can eliminate the need for impedance matching components (such as capacitors, inductors and resistors) for matching the impedance of the electronics of a system to the impedance of an antenna, and as illustrated in an exemplary application below, the distributed strip configuration 108 allows for realizing the antenna in a small form factor (<¼λ) while maintaining manufacturable dimensions within the layout and construction of an antenna. The width 132 of conductor 106 in the distributed strip configuration is greater than the width 126 of the conductor 102 of the folded line configuration. In other embodiments, the width 132 is at least ten times greater than the width 126. In still other embodiments, the width of the conductor 106 can equal the full width 134 of the distributed strip configuration 108 (for example, the distributed strip configuration would have no gap or slot intruding the conductor 106). The width 134 of the distributed strip configuration 108 can, for convenience, be set equal to the width 130 of the folded line configuration 104 (as shown in FIG. 1B). The distributed strip can comprise any geometrical shape of convenience, for example a triangle, circle, trapezoid or ellipse. In this embodiment the folded line configuration 104, distributed strip configuration 108 and the ground configuration 114 are arranged to be coplanar and aligned along the length of the antenna.

Within the folded line configuration 104, the width 126 of the of the conductor 102, the spacing 128 between adjacent legs, the overall width of the folded line configuration 130, and layout of the folded line configuration (i.e. meander pattern as shown, serpentine, spiral and helical patterns are also possible) in combination with the layout of the distributed strip configuration determines the antenna's resonant frequency and performance characteristics. In other embodiments, it can be desired to encapsulate the antenna within a dielectric medium (not shown) for reasons such as environmental protection or to create a form factor suitable to a next assembly. Suitable encapsulants can include polymers, glasses, ceramics, glass-ceramics and composite materials.

Figure 2A:
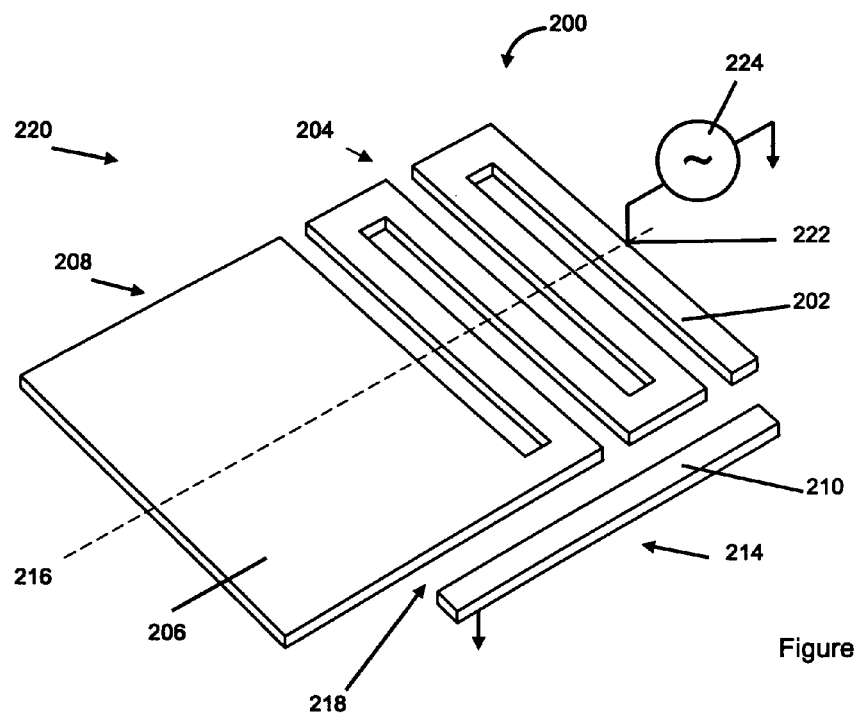
FIGS. 2A through 2C are schematic perspective views of embodiments of antennas according to the present invention.
Figure 2B:
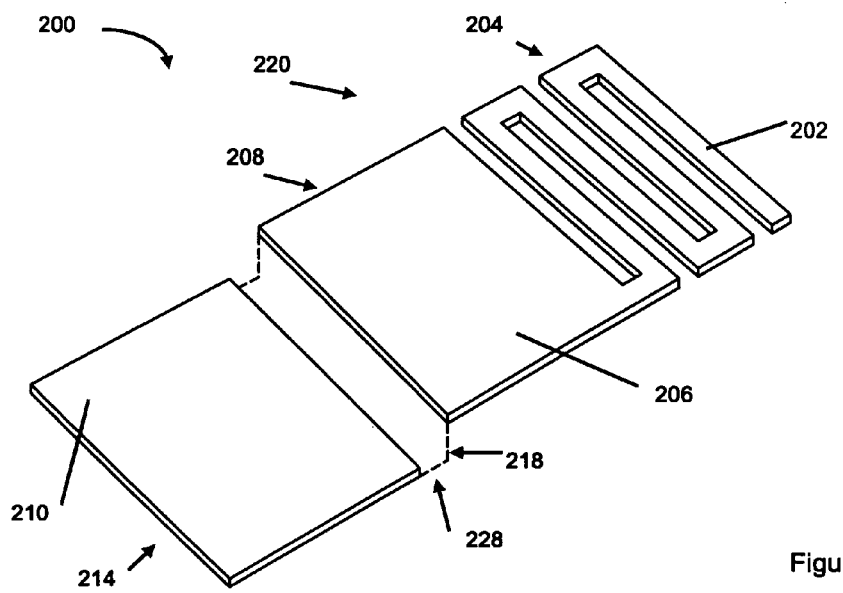
Figure 2C:
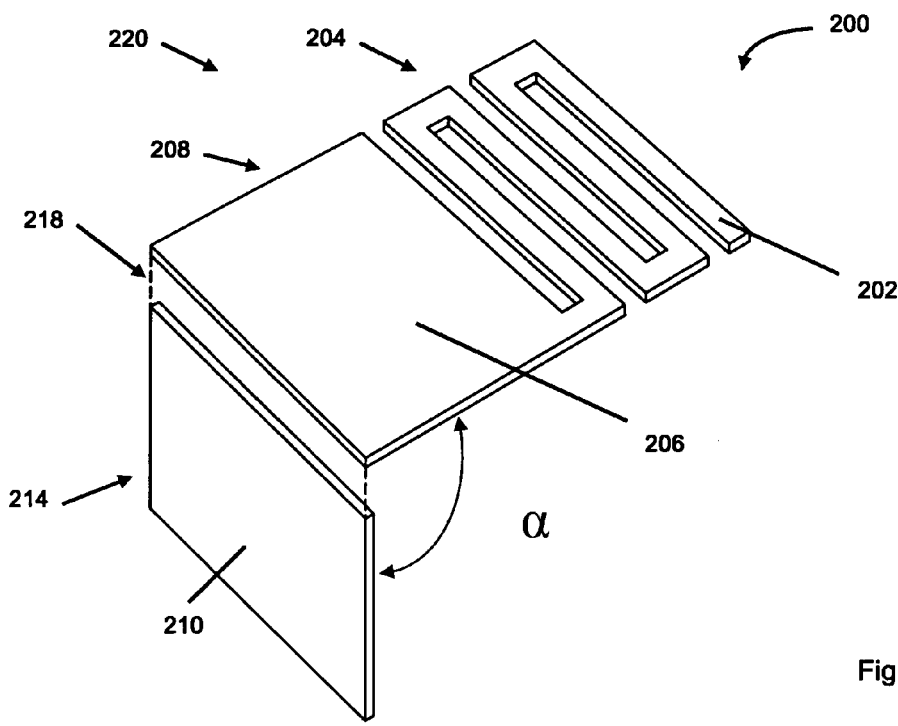

FIGS. 2A, 2B and 2C are schematic perspective views of other embodiments of antennas according to the present invention, wherein alternate arrangements of the ground conductor 210 relative to the radiating element 220 of an antenna 200 are illustrated.

FIG. 2A illustrates an embodiment where the conductor 210 comprising the ground 214 is not located along the same axis 216 as the radiating element 220. The ground conductor 210 is spaced from the radiating element 220 by a gap 218 (as described above). The gap need not be uniform as illustrated in FIG. 2A, but could for example, be tapered from end to end. In FIG. 2A, a signal feed 222 can be located along the conductor 202 within the folded line configuration 204. Locating the signal feed within the folded line configuration can be convenient depending on the relative orientation of the radiating element 220 with respect to a systems electronics 224. In other applications, locating the signal feed within the distributed strip configuration 208 has been found to facilitate "fine tuning" of an antenna, by allowing access for trimming the length of the conductor 202 within the folded line configuration.

FIG. 2B illustrates an embodiment where the ground conductor 210, configured as a ground plane 214, lies within a plane spaced by a distance 218 from the plane containing the radiating element 220, as can occur for example, in an application where the radiating element 220 and the ground conductor 210 lie on separate boards within a system, or are disposed on separate portions or surfaces of a case or housing. In this embodiment, the ground plane configuration 214 is substantially parallel to the plane containing the folded line 204 and distributed strip 208 configurations. This arrangement can occur for example, where a board or housing upon which one of the conductors (202, 206, 210) is disposed comprises a curvature or shape causing deviations from the geometrically ideal, infinitely parallel condition. Such deviations can be accommodated for in the design of the layout of the antenna and are of no significance to the present invention.

The edge of the ground plane configuration can additionally be spaced by a distance, or gap 228, from the edge of the radiating element 220. The gap 228 can be used to prevent portions of the ground plane configuration 214 from overlaying portions of the radiating element 220. If for example, a substantial portion of the ground plane configuration 214 were to overlay the radiating element 220, the electrical length of the radiating element as measured along its primary axis would effectively be reduced, and this would need to be compensated for in the design of the antenna. As defined and used herein the ground conductor 210 is said to be laterally separated from the conductors 202 and 206 comprising the radiating element, wherein the ground conductor 210 does not substantially overlay either of the conductors 206 or 202. This definition applies equally well in embodiments where conductors are arranged to lie within a common plane as for example, in FIGS. 1A, 2A, 3, 4A, 5, 7 and 8, as well as those embodiments where conductors are arranged to lie within more than one plane as for example, in FIGS. 2B, 2C and 6.

FIG. 2C illustrates an embodiment where the ground conductor 210, configured as a ground plane 214, lies within a plane spaced by a distance 218, and arranged at an angle α, from the plane containing the radiating element 220, as can occur for example, in an application where it is desired to have the radiating element 220 stand out and away from a surface of the system within which the antenna is housed. The angle α can be ninety degrees for example, where it is desired to maximize the height of the radiating element above a system board.

Figure 3:
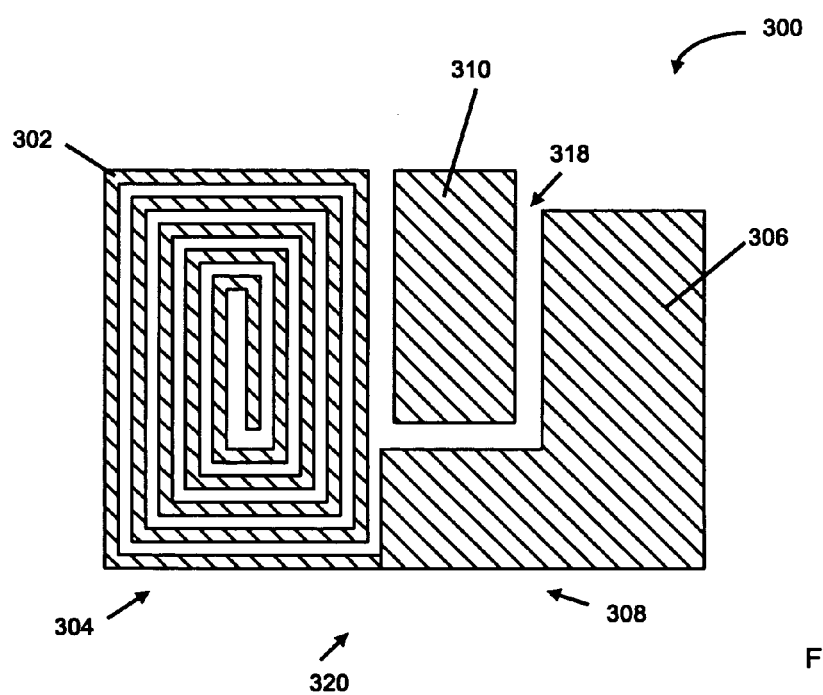
FIG. 3 is a schematic illustration of another embodiment of an antenna according to the present invention.

FIG. 3 is a schematic illustration of another embodiment of an antenna 300 according to the present invention. Antenna 300 comprises a radiating element 320, having a folded line configuration 304 wherein conductor 302 is arranged in a spiral configuration, a distributed strip configuration 308 having conductor 306, and a ground comprising a conductor 310 spaced from conductors 306 and 302 by a gap 318. FIG. 3 serves to illustrate an embodiment where the layout of the ground conductor 310 intrudes into the layout of the radiating element 320, while not directly contacting the conductors 306 or 302.

Figure 4A:
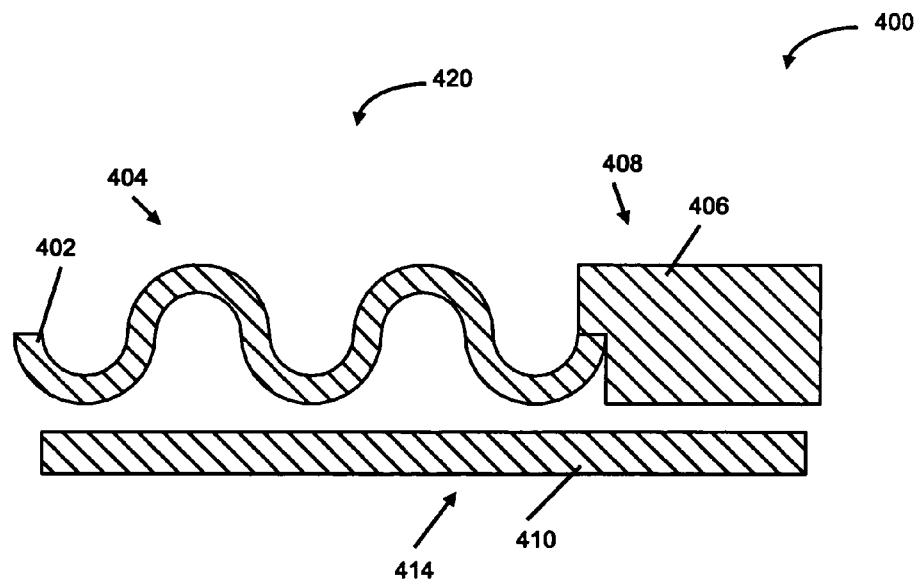
FIGS. 4A and 4B are schematic illustrations of additional folded line configurations as can be used in antennas according to the present invention.
Figure 4B:
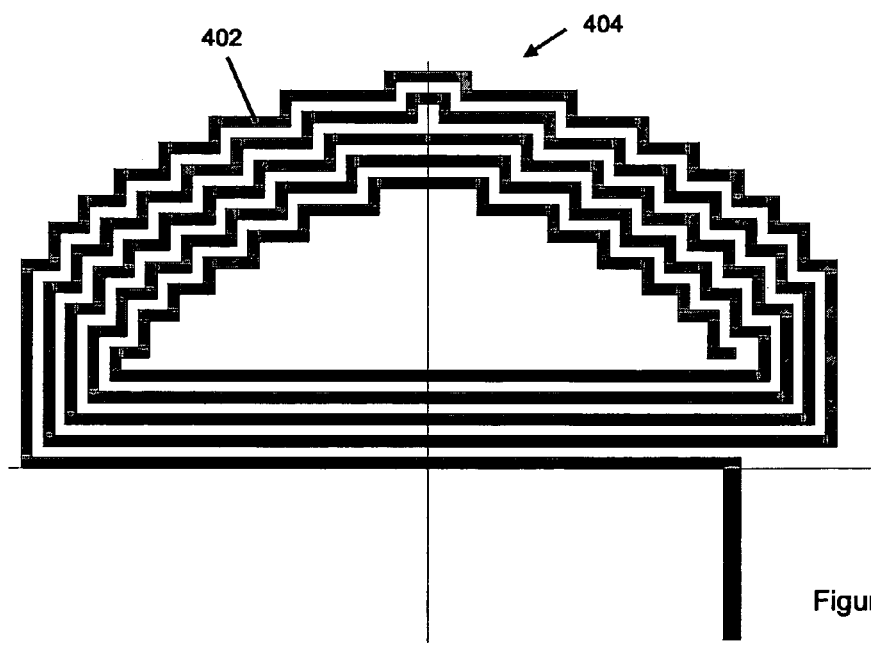

FIGS. 4A and 4B are schematic illustrations of folded line configurations as can be found in antennas according to the present invention. In FIG. 4A antenna 400 comprises a radiating element 420 having conductor 402 arranged in a serpentine folded line configuration 404, electrically connected to a distributed strip configuration 408 comprising conductor 406. Ground conductor 410 is not directly connected to either of the conductors 402 or 406, comprising the radiating element 420.

FIG. 4B illustrates another embodiment of a folded line configuration 404 comprising conductor 402 arranged in a spiral configuration. Examples of folded line configurations include conductors arranged as meander lines, loops, serpentine lines, spirals (round or square), and helixes as can be formed of vertically interconnected conductor portions on multiple layers of a printed wiring board.

Figure 5:
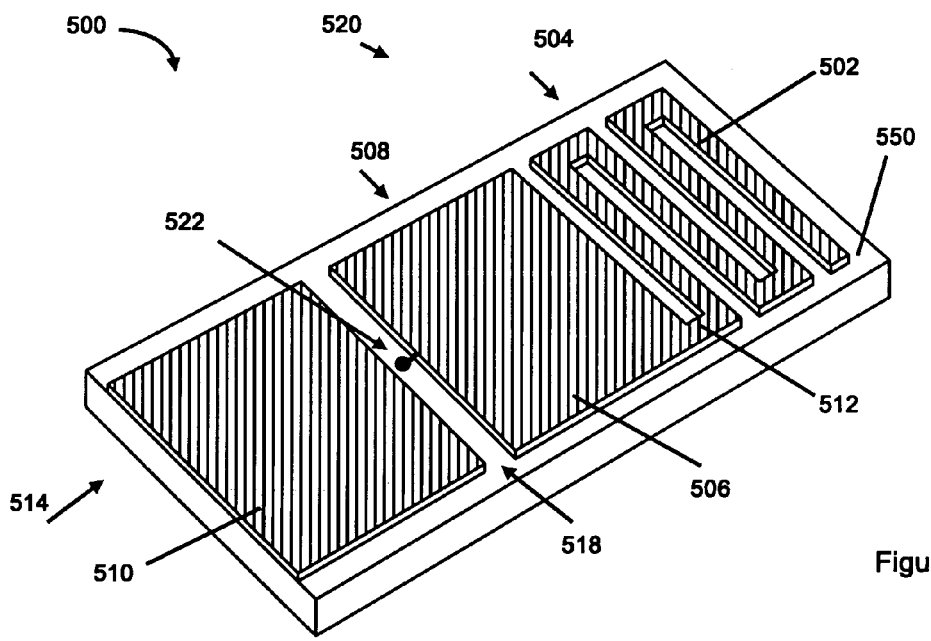
FIGS. 5 and 6 are schematic perspective views of embodiments of antennas produced on planar dielectric substrates, according to the present invention.

FIG. 5 is a schematic perspective illustration of an embodiment of an antenna 500 according to the present invention, as constructed on a dielectric substrate, for example a printed wiring board 550. In this embodiment the conductors 502, 506, and 510, arranged respectively as folded line 504, distributed strip 508 and ground plane 514 configurations, are disposed on a surface of the printed wiring board 550. A signal feed 522 to the antenna can be provided by an electrical via through the printed wiring board 550, disposed within the gap 518 between the ground plane configuration and the distributed strip configuration. This would allow for example, placing electrical components (not shown) on the opposed side of the printed wiring board 550.

Examples of materials that dielectric substrate 550 can comprise include but are not limited to: ceramics and glasses, such as alumina, beryllium oxide, silicon nitride, aluminum nitride, titanium nitride, titanium carbide, silicon carbide, diamond and diamond like substrates, glass-ceramic composite, low temperature co-fired ceramic multilayered material or high-temperature co-fired ceramic multilayered material; polymers such as a plastic, glass-polymer composite, a resin material, a fiber-reinforced composite, a printed wiring board composition, epoxy-glass composite, epoxy-polyimide composite, polyamide, fluoropolymer, polyether ether ketone or polydimethylsiloxane; and insulated metal substrates such as a glass-coated metal.

Figure 6:
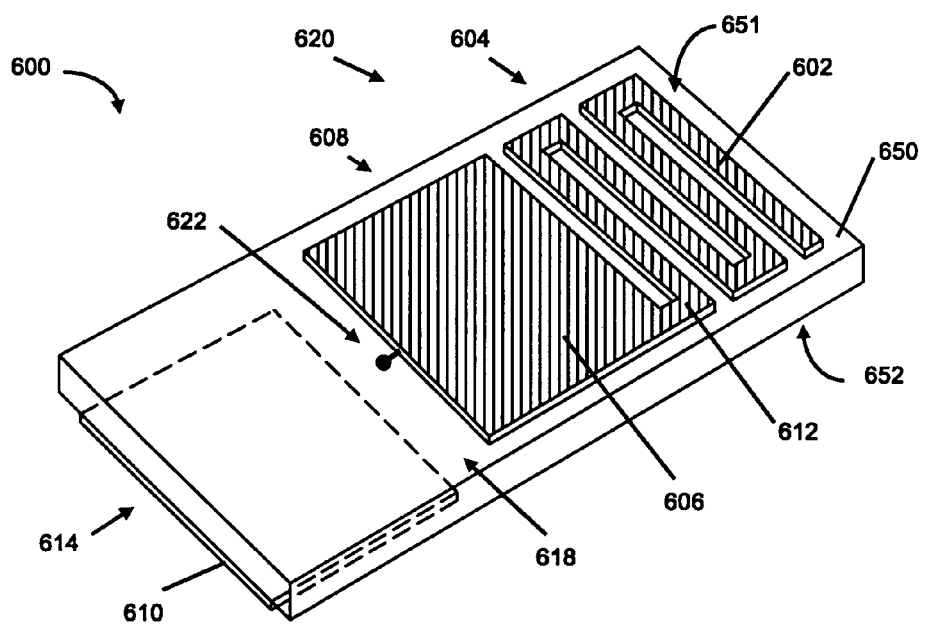

FIG. 6 is a schematic perspective illustration of an antenna 600 according to the present invention, constructed on a dielectric substrate, for example a printed wiring board 650. In this embodiment the conductors 602 and 606 are arranged respectively as folded line 604, and distributed strip 608 configurations, and are disposed on one side 651 of the printed wiring board 650, while a conductor 610 arranged as a ground plane configuration 614 is disposed on the opposed side 652 of the board. The ground plane configuration 614 is positioned relative to the radiating element 620 of the antenna (e.g. with a lateral spacing 618), so that portions of the folded line 604 and distributed strip 608 configurations do not substantially overlay the ground plane configuration 614. A substantial amount of overlay is one that would degrade the electrical performance of the antenna by an amount unacceptable to the requirements of the system. In this example, the gap 618 is maintained between the edge of the radiated element 620 and the ground plane configuration 614. A signal feed 622 to the antenna can be provided within the gap 618 between the ground plane configuration 622 and the distributed strip configuration 608.

Figure 7:
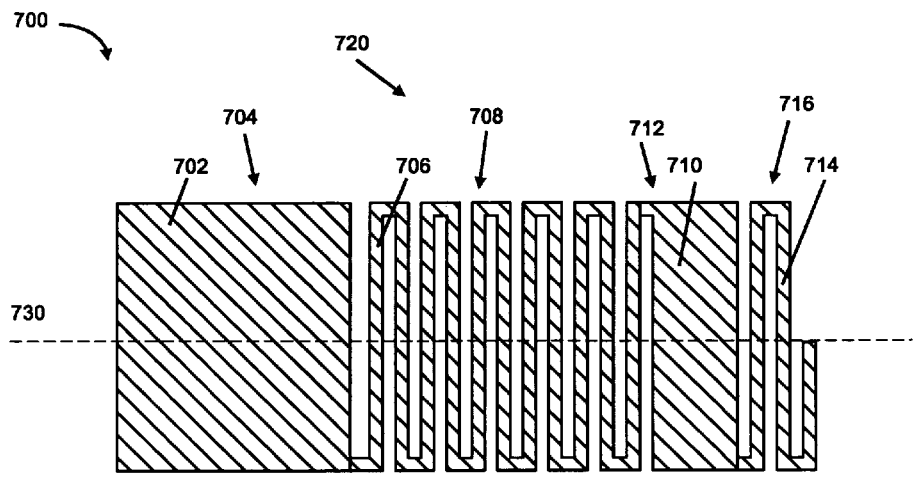
FIGS. 7 and 8 are schematic illustrations of embodiments of radiating elements as can be used in antennas according to the present invention.

FIG. 7 is a schematic illustration of another embodiment of an antenna 700, according to the present invention. In this embodiment, the radiating element 720 of antenna 700 comprises multiple distributed strip configurations 704 and 712, interconnected with multiple folded line configurations, 708 and 716, and arranged to lie along an axis 730. A ground configuration not shown, could be provided for example, on the same surface (or an opposed surface) of a dielectric upon which the conductors 702, 706, 710 and 714 reside. Multiple folded line configurations that are not necessarily identical, as well as multiple distributed strip configurations that are not necessarily identical (i.e. differing conductor widths and/or lengths, configuration widths and/or lengths) can be used where it is desired to broaden the bandwidth of the antenna. Electrical connection to the radiating element 720 can be made at any point along the conductors 702, 706, 710 and 714 and can be determined, by convenience and proximity to the electronics of a system. In other embodiments, an electrical connection can be made to the antenna along an edge of the conductor 702, to allow fine tuning of the antenna's electrical performance by trimming the length of the electrical conductor 714.

Figure 8:
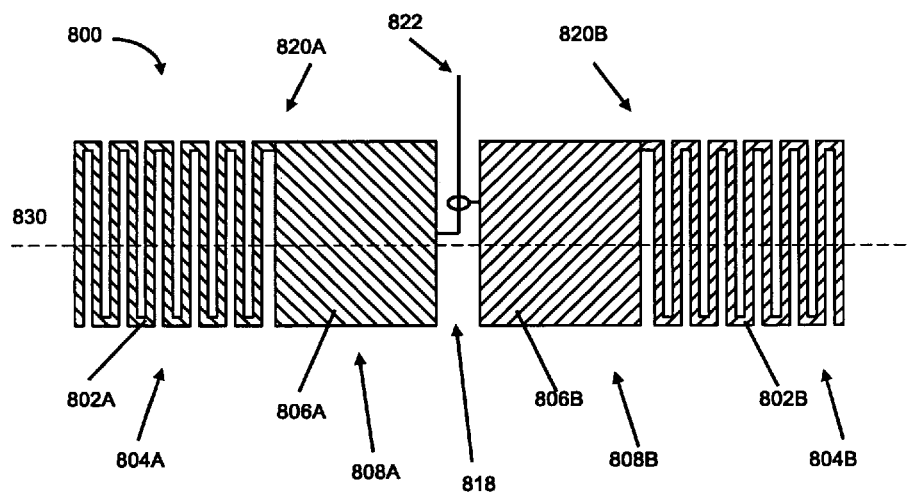

FIG. 8 is a schematic illustration of another embodiment of an antenna 800 according to the present invention. Antenna 800 comprises two radiating elements 820a and 820b, spaced apart by the gap 818 and arranged along an axis 812. An antenna feed 822 can be located within the gap 818. The gap can range in size from as small as manufacturing permits with the upper end on the gap size being established by the requirement that the radiating elements be electrically connected (i.e. capacitively and/or inductively). Each radiating element comprises a conductor, 806a and 806b, arranged in a distributed strip configuration 808a and 808b, and a conductor 802a and 802b arranged in a folded line configuration 804a and 804b. It is not necessary that the two radiating elements 820a and 820b be symmetrical, nor is it necessary that the two radiating elements be oriented so as to have their respective distributed strip configurations 808a and 808b, to be adjacent. In some applications, orienting the two radiating elements 820a and 820b as shown in FIG. 8 (adjacent distributed strip configurations) can allow for fine tuning of the antenna's resonant frequency by trimming the length of the conductors 802a and 802b in the folded line configurations, 804a and 804b.

In an exemplary application, an antenna was produced in accordance with the present invention and as schematically illustrated in FIG. 6. A radiating element was formed as an etched copper pattern on one side of an epoxy-glass printed wiring board and a ground plane formed as an etched copper pattern on the opposed side of the board. The antenna was designed to resonate at 433 MHz and be matched to an impedance of 50 ohms. This frequency (433 MHz) is heavily used for short-range wireless devices and RFID systems and provides an effective demonstration of this invention at a wavelength where significant size reductions are desired. Modeling the characteristics of the antenna versus the layout, i.e the physical, parameters of the antenna, was accomplished by a numerical method known as the "method of moments" that is embodied in commercially available software. Using the method of moments methodology, the layout parameters of an antenna as listed in Table I, were determined to provide the desired resonant frequency and impedance.

TABLE 1

Antenna Physical Dimensions (433 MHz, 50 Ohm Impedance)

| | |
|---|---|
| Printed Wiring Board Thickness | 0.5 mm |
| Width of antenna | 25 mm |
| Folded Line Configuration | Meander |
| Number of Turns in Folded Line Configuration | 11 |
| Width of Conductor in Folded Line Configuration | 0.25 mm |
| Spacing Between Adjacent Conductor Legs in Folded Line Configuration | 0.5 mm |
| Length of Capacitive Strip Configuration | 10.75 mm |
| Length of Ground Plane | 98.5 mm |
| Total Length of Radiating Element | 2.71 cm (0.039 wavelengths) |

The thickness of the printed wiring board, i.e dielectric substrate, has little impact on the performance of the antenna, and was selected as a matter of convenience for the present application. The width and length of the antenna were established by the physical constraints of the system within which the antenna was required to fit. The width of the folded line configuration, the capacitive strip configuration and the ground configuration were set to equal the width of the antenna. The parameters that were adjustable in the model of the antenna were the number of turns in the folded line configuration, the width of the conductor within the folded line configuration, the spacing between adjacent conductor legs in the folded line configuration and the length of the capacitive strip configuration. As can be seen in Table I, the overall form factor for the antenna is very compact, for example, the length of the radiating element is $0.039\lambda$, and the width of the antenna is 25 mm, while the width of the conductor in the folded line configuration is 0.25 mm and the spacing between adjacent legs in the folded line configuration is 0.5 mm, which are easily manufactured in a printed wiring board technology.

The present invention additionally provides antennas having a distributed strip and integrated electronic components mounted on or in close proximity to the distributed strip, which allows for additional size and space savings without significantly degrading the performance of the antenna. Embodiments of the invention include antennas having a distributed strip, integrated with batteries mounted on or in close proximity to the distributed strip.

Figure 9A:
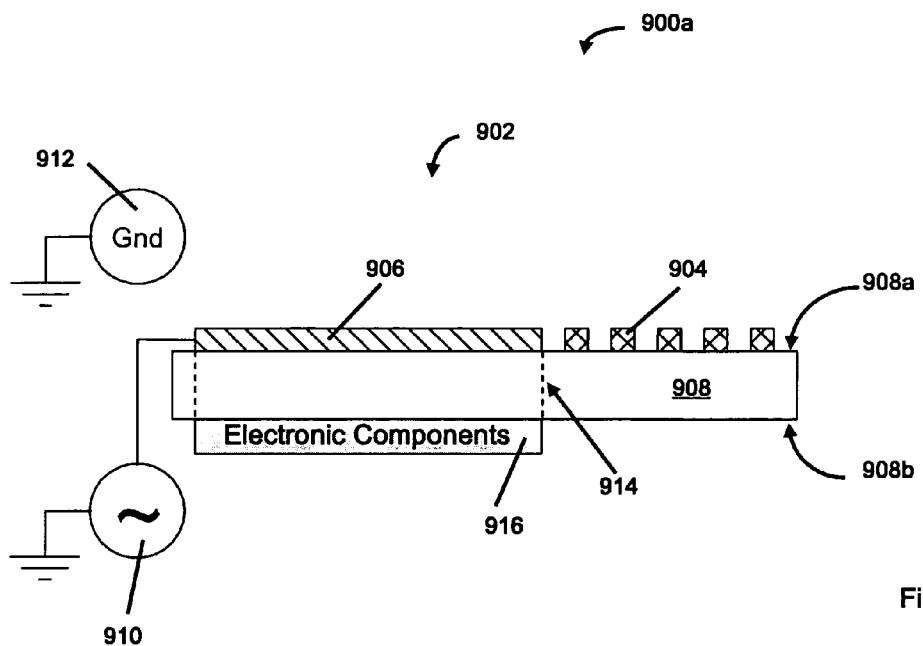
FIG. 9A is a schematic cross-sectional illustration of an embodiment of an antenna comprising a distributed strip and integrated electronic components according to the present invention.

FIG. 9A is a schematic cross-sectional illustration of a first embodiment of an antenna 900a with a distributed strip and integrated electronic components according to the present invention. Antenna 900a comprises a radiating element 902 disposed on a first surface 908a of a dielectric substrate 908, and electronic components 916 disposed on an opposed surface 908b of the substrate. Dielectric substrate 908 can be, for example, a printed wiring board as may be incorporated within a wireless device. The radiating element 902 comprises conductor 904 arranged in a folded line configuration, electrically connected to the conductor 906, arranged in a distributed strip configuration. A signal to drive the radiating element 902 can be provided by a circuit 910 electrically connected to the radiating element. A ground 912 can be provided in proximity to the radiating element, for example, within the wireless device, to allow electrical coupling (i.e. inductive or capacitive coupling) of the ground to the radiating element, but not in direct connection to the radiating element 902. Ground 912 could be for example, located on a second printed wiring within the wireless device. By mounting electronic components substantially within the outer extents 914 (i.e. the width and length extents) of the conductor 906 arranged in a distributed strip configuration, the electrical performance of the antenna 900a is not significantly degraded, and the layout of the antenna 900a can be designed to satisfy the performance requirements of a device incorporating the antenna 900a. This is also the case where an electronic component may "overhang" a portion of the extents of the distributed strip configuration.

Mounting of electronic components 916 substantially within the area defined by the outer extents 914 of the conductor 906 arranged in a distributed strip configuration provides for reducing the overall size of the antenna 900a, including the electronic components 916. Electronic components 916 can include optical and electrical components including resistors, capacitors, inductors, transistors, diodes, integrated circuits, SAW devices, filters, resonators, a second radiating element, a power supply and, power generating and conditioning components such as batteries, electromagnetic induction pads (e.g. as used in wireless charging configurations) and solar cells. Electronic components 916 can be mounted to a surface of the printed wiring board 908, for example including mounting directly on top of a conductor (i.e. 906) disposed on a surface of the printed wiring board, by any number of methods including the use of adhesives, solders, tapes (i.e. adhesive backed or double sided) and encapsulation and over molding (discussed below). Where components 916 include a second radiating element, the second radiating element (i.e. antenna) can be incorporated with or without a distributed strip, and can be designed to operate at a frequency substantially equal to or differing from the radiating element 902.

Examples of materials that dielectric substrate 908 can comprise include but are not limited to: ceramics and glasses, such as alumina, beryllium oxide, silicon nitride, aluminum nitride, titanium nitride, titanium carbide, silicon carbide, diamond and diamond like substrates, glass-ceramic composite, low temperature co-fired ceramic multilayered material or high-temperature co-fired ceramic multilayered material, polymers such as a plastic, glass-polymer composite, a resin material, a fiber-reinforced composite, a printed wiring board composition, epoxy-glass composite, epoxy-polyimide composite, polyamide, fluoropolymer, polyether ether ketone or polydimethylsiloxane, textiles and, insulated metal substrates such as a glass-coated metal. Electronic components 916 can be mounted to the dielectric substrate by mounting methods including adhesives, double sided adhesive tapes, solders, through-hole mounting, surface mount techniques and other mounts commonly employed in electronic circuit assembly.

Figure 9B:
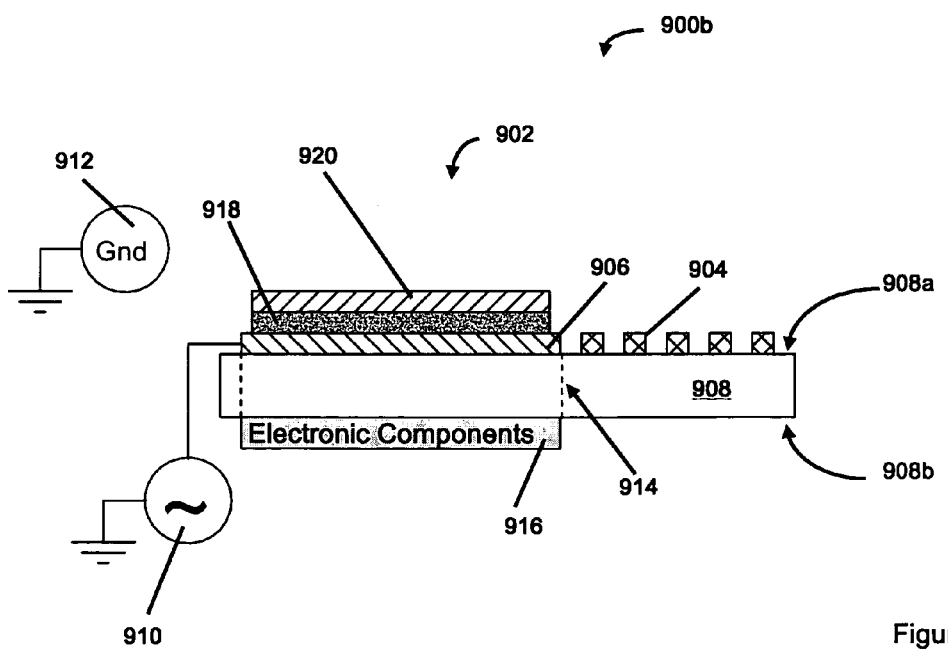
FIG. 9B is a schematic cross-sectional illustration of another embodiment of an antenna comprising a distributed strip and an integrated battery according to the present invention.

FIG. 9B is a schematic cross sectional illustration of another embodiment of an antenna 900b with a distributed strip and integrated electronic components. Antenna 900b comprises a battery 920 mounted on top of the distributed strip configuration 906, for example, by an adhesive layer 918 and electronic components 916 mounted on the opposed side 908b of the dielectric substrate 908. The battery 920 and the electronic components 916 are each mounted substantially within the extents of the distributed strip configuration 906. Within the context of the present disclosure, mounting of electronic components on a surface of a dielectric substrate, includes the case where an electrical conductor may be disposed between the electrical components and the surface of the substrate. The battery 920 can be electrically interconnected to the electronic components and/or the signal generation circuit 910 by electrical conductors (not shown).

Figure 10A:
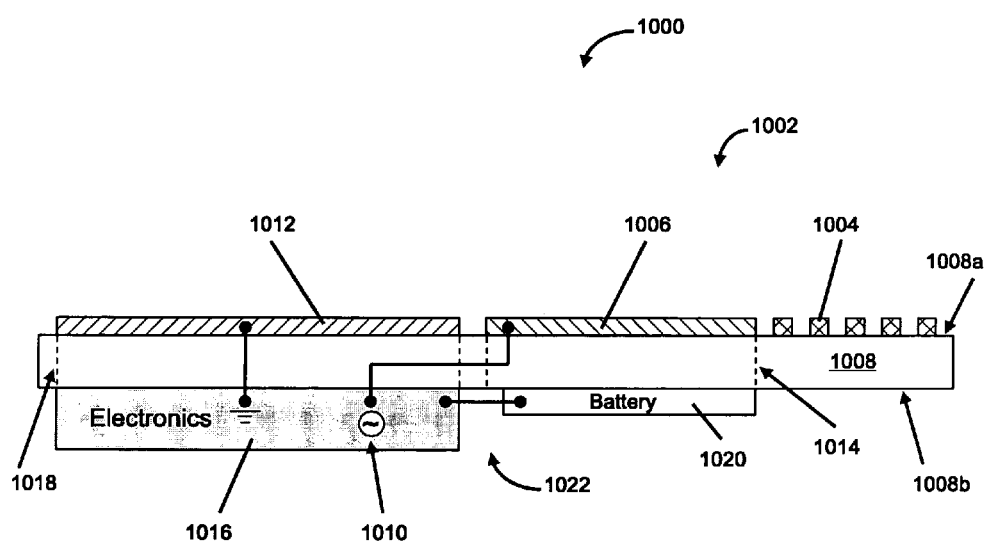
FIGS. 10A and 10B are schematic cross-sectional illustrations of further embodiments of antennas comprising a distributed strip and integrated electronic components, according to the present invention.

FIG. 10A is a cross-sectional illustration of another embodiment of an antenna 1000 with a distributed strip and integrated electronic components, according to the present invention. Antenna 1000 includes a radiating element 1002, comprising conductor 1004 arranged in a folded line configuration, electrically connected to conductor 1006 arranged in a distributed strip configuration and, a ground conductor 1012 (e.g. a ground plane) laterally separated from the radiating element 1002, wherein the electrical conductors are disposed a surface 1008a of the dielectric substrate 1008. The ground conductor 1012 is electrically coupled to (i.e. capacitively and/or inductively) but not directly connected to the conductors comprising the radiating element 1002. Electronic components 1016 and battery 1020 are mounted on the opposed surface 1008b of the dielectric substrate. In this arrangement, a compact antenna 1000 including conductors 1012, 1006 and 1004 can be fabricated on one surface of a dielectric substrate (e.g. a printed wiring board) and electronic components 1016 and a battery 1020 as may comprise a wireless device, can be mounted on the opposed surface of the substrate, providing a reduction in the overall size of the wireless device.

The electronic components 1016 are mounted substantially within the area defined by the extents 1018 of the ground conductor 1012 (i.e. the ground plane) and a battery 1020 for powering the electronic components 1016 is mounted substantially within the extents 1014 of the distributed strip conductor 1006. By mounting electronic components 1016 substantially within the extents 1018 of the ground conductor 1012, and the battery 1020 substantially within the extents 1014 of the distributed strip conductor 1006, the performance of the antenna 1000 is not significantly degraded, i.e. perturbations in the antennas performance due to the presence of the components and battery can be accommodated for in the design of the antenna.

The antenna 1000 and integrated electronic components 1016 and battery 1020 can be produced in a compact form. In this exemplary embodiment, the battery 1020 and electronics 1016 are mounted on the same side 1008b of the dielectric substrate 1008. In other embodiments, batteries and electronic components can both be mounted on opposed surfaces of the dielectric substrate as an application may require, and alternatively, can be mounted on top of and, substantially within the extents of, the conductors comprising the ground plane 1012 and the distributed strip configuration 1006 (for example, as shown in FIG. 9B). Additionally, a battery could be mounted within the extents of the ground plane and, electronic components mounted within the extents of the distributed strip, as an application might require. The battery 1020, electronic components 1016, signal generating circuit 1010, ground plane 1012 and radiating element 1002 can be interconnected by conductors 1022 fabricated on the surface of or within the interior of the dielectric substrate, e.g. a printed wiring board.

Figure 10B:
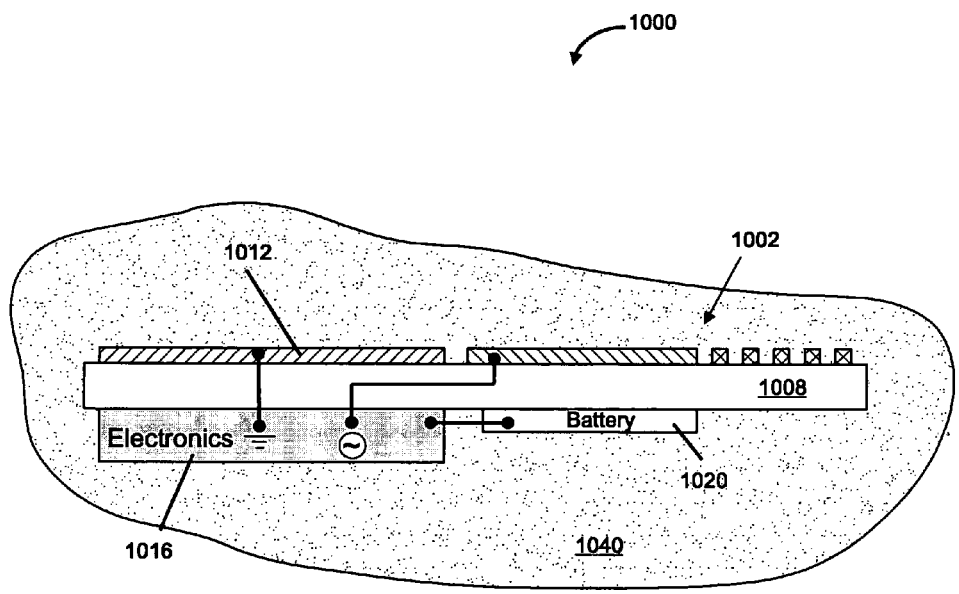

FIG. 10B illustrates that all or part of the antenna 1000 can be encapsulated in a dielectric medium 1040 (as described above) for example to provide environmental protection of the components, facilitate fitting the antenna 1000 into a next assembly (not shown) and adhering (e.g. mounting) electronic components including batteries to the printed wiring board 1008. In some applications, it may be desired to mount an electronic component, such as a battery, to the printed wiring board by a mechanical clamping mechanism. The ground conductor 1012 and the radiating element 1002 can be disposed on the same surface of substrate 1008 (as illustrated) or alternatively the ground conductor and the radiating element can be disposed on opposite surfaces of the substrate, having no effect on the practice of the invention. More than one radiating element could be disposed on the substrate, for example, to produce an antenna functioning over a broader bandwidth, or for example, to produce an antenna operating at multiple resonant frequencies.

Figure 11A:
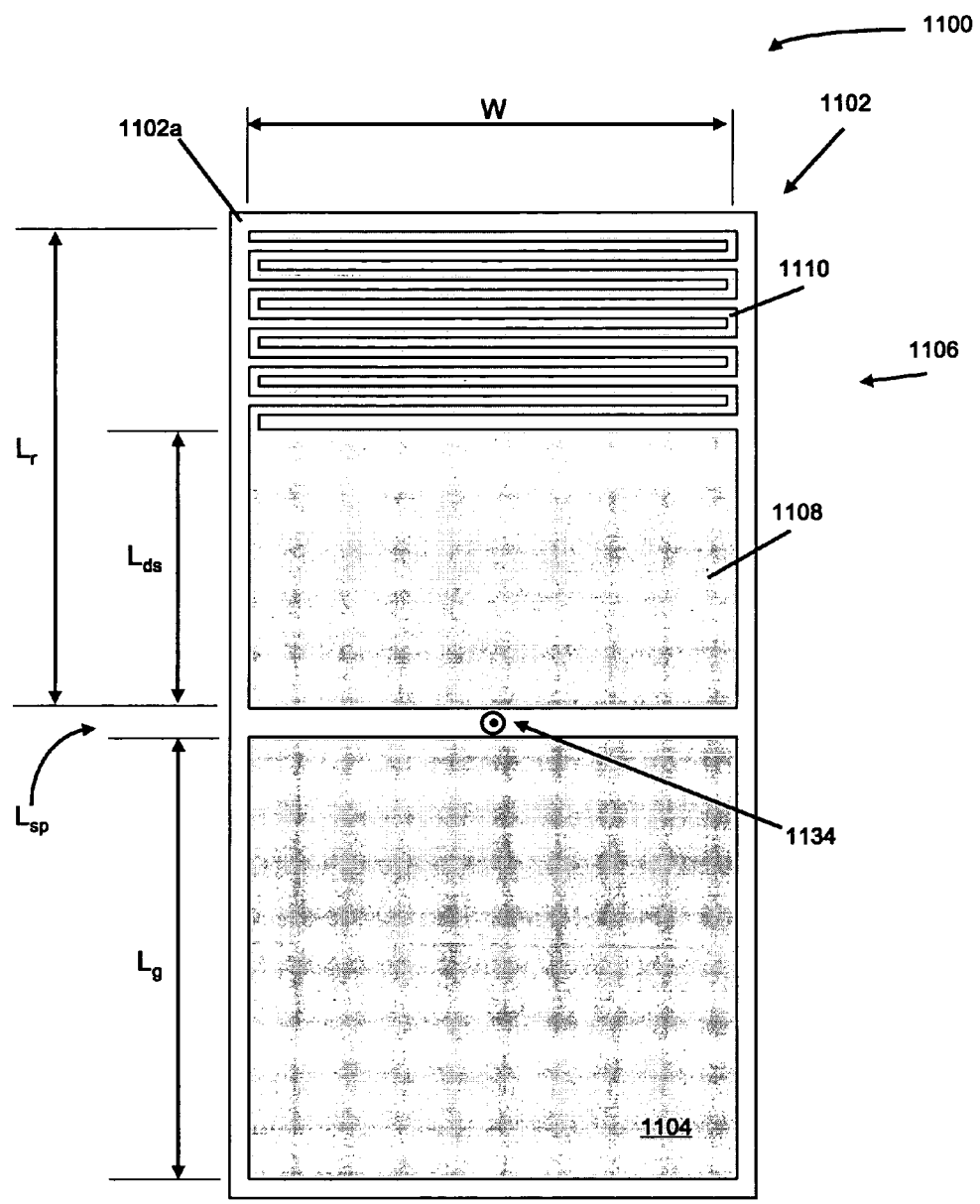
FIGS. 11A and 11B are schematic illustrations of the front side and the back side of another embodiment of an antenna comprising a distributed strip and integrated electronic components, according to the present invention.
Figure 11B:
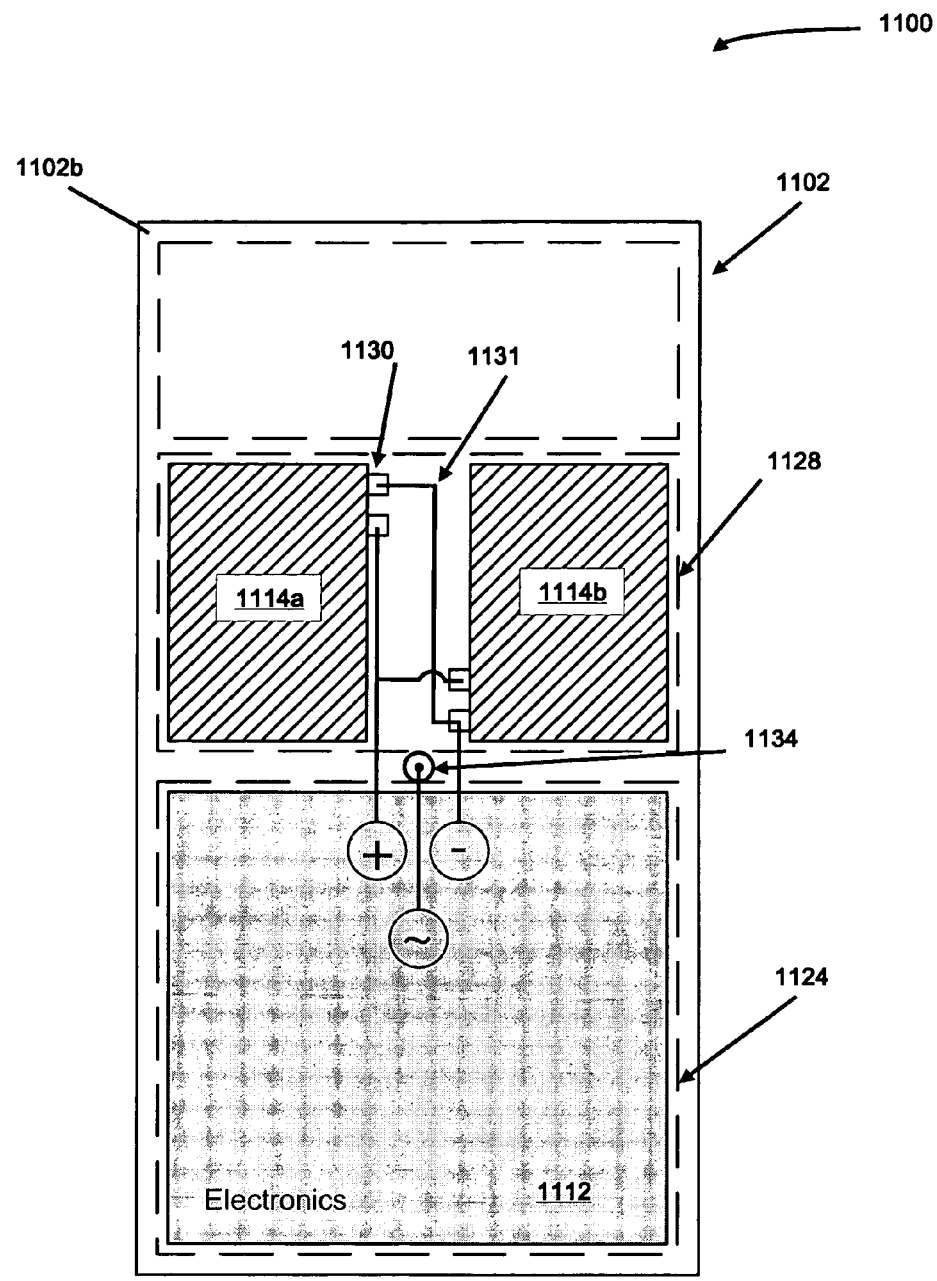

FIGS. 11A and 11B are schematic illustrations of the front and back respectively, of another embodiment of an antenna 1100 with a distributed strip and integrated electronic components, according to the present invention. In this example, antenna 1100 was designed to fit within the housing of a compact wireless transceiving device operating at 433 MHz. The dimensions of the housing constrained the width of the antenna, "W", to 50 mm and the length of the radiating element, "Lr", to 46 mm. Antenna 1100 was produced on a 0.25 mm thick epoxy-glass printing wiring board 1102 comprising patterned copper conductors on both the front surface 1102a and back surface 1102b of the board. A ground plane 1104, and radiating element 1106, comprising conductor 1108 arranged in a distributed strip configuration and conductor 1110 arranged in a folded line configuration, were patterned on the front surface 1002a of the board.

In order to design the layout of antenna 1100 within the device size constraints, the approach mounts the transceiver electronics 1112 opposite the ground plane 1104, and within the area defined by the extents 1124 of the ground plane. Furthermore, the design mounts batteries 1114a and 1114b for powering the wireless device, opposite and within the area defined by the extents 1128 of the distributed strip conductor 1108. Interconnection pads 1130 and wiring 1131 were patterned on the back surface 1102b of the board, to interconnect the batteries 1114a-b, transceiver electronics 1112 and radiating element 1106. A via feed 1134 located in a gap between the ground plane 1104 and distributed strip conductor 1108, was utilized to connect the radiating element 1106 to the transceiver electronics 1112.

The dimensions of the batteries 1114a-b (20 mm×30 mm×2 mm thick) and narrow width "W" of the antenna required the length, "Lds", of the distributed strip configuration to be at least 30 mm. Additionally, the number of turns and the line width and spacing in the folded line configuration 1110 were chosen so that the antenna resonated at 433 MHz. This problem is sufficiently constrained so that dimensions for the layout of the antenna could be determined interactively with an electromagnetic simulator, using the "method of moments" technique. For less constrained problems, optimization routines now included in commercial electromagnetic simulators prove useful and can allow the designer to achieve a desired tradeoff between the relevant parameters such as, antenna gain, bandwidth, and size.

With the constraints described above, the dimensions of the antenna 1100 are listed in Table 2, as determined by the method of moments technique. In the present example line widths and spacings, as well as the gap between the folded line configuration and the distributed strip, have equal values for convenience in the layout, but this is not necessary to the practice of the invention.

TABLE 2

Antenna Layout Dimensions (433 MHz, 50 Ohm Impedance)

| | |
|---|---|
| Printed Wiring Board Thickness | 0.25 mm |
| Width of antenna (W) | 50 mm |
| Folded Line Configuration | Meander |
| Number of Turns in Folded Line Configuration | 5 |
| Width of Conductor in Folded Line Configuration | 0.8 mm |
| Spacing Between Adjacent Conductor Legs in Folded Line Configuration | 0.8 mm |
| Length of Capacitive Strip Configuration ($L_{ds}$) | 30 mm |
| Total Length of Radiating Element ($L_r$) | 46 mm (0.07 λ) |
| Lateral Spacing Between Ground Plane and Radiating Element ($L_{sp}$) | 0.83 mm |
| Length of Ground Plane ($L_g$) | 39 mm |
| Total Length of Antenna (Radiating Element + Ground Plane) | 86 mm (0.12 λ) |

Experimental measurements, listed in Table 3, indicate that the presence of the batteries 1114*a-b*, mounted opposite the distributed strip conductor 1108 have an insignificant effect on the performance of the antenna. Other experiments have shown that the batteries 1114*a-b*, can in the alternative, be mounted on top of the distributed strip 1108. The arrangement shown in FIGS. 11A and 11B was chosen to facilitate the integration of the electronics 1112, with the batteries 1114*a-b*, and the antenna.

TABLE 3

Comparison of Antenna Performance, With and Without the Presence of Batteries Mounted Opposite the Distributed Strip Conductor

| | Batteries in Place | Batteries Removed |
|---|---|---|
| Bandwidth (MHz) | 15.7 | 16.1 |
| Bandwidth (%) | 3.7 | 3.8 |
| Quality Factor, Q | 18.9 | 18.6 |
| Gain (dB) | −1.0 | −0.7 |
| Efficiency (%) | 40 | 46 |

The batteries 1114*a-b* in the above exemplary application were chosen for their low profile and small form factor, and can be selected from commercially available batteries including lithium ion, lithium manganese dioxide, nickel-cadmium in various form factors including prismatic (rectangular), thin prismatic, thin-film, cylindrical cells and coin cells. In addition, solar cells, or electromagnetic induction pads could be utilized.

In some applications it can be desirable to incorporate radio frequency (RF) chokes or filters in the wiring, e.g. 1131, to prevent RF energy from the antenna, from entering or being dissipated within the batteries 1114*a-b* or other electronic components, e.g. 1112. Conventional means can be used to achieve this goal including the use of RF choking components such as inductors, ferrite chips, and ferrite beads, on power and signal lines. Additional approaches to suppress electromagnetic coupling include the use of a bandstop component such as a stub, filter, resonant cavity, frequency selective surface, electromagnetic bandgap structure, a defected ground plane, and the use of shielding layers within a printed wiring board.

Figure 12:
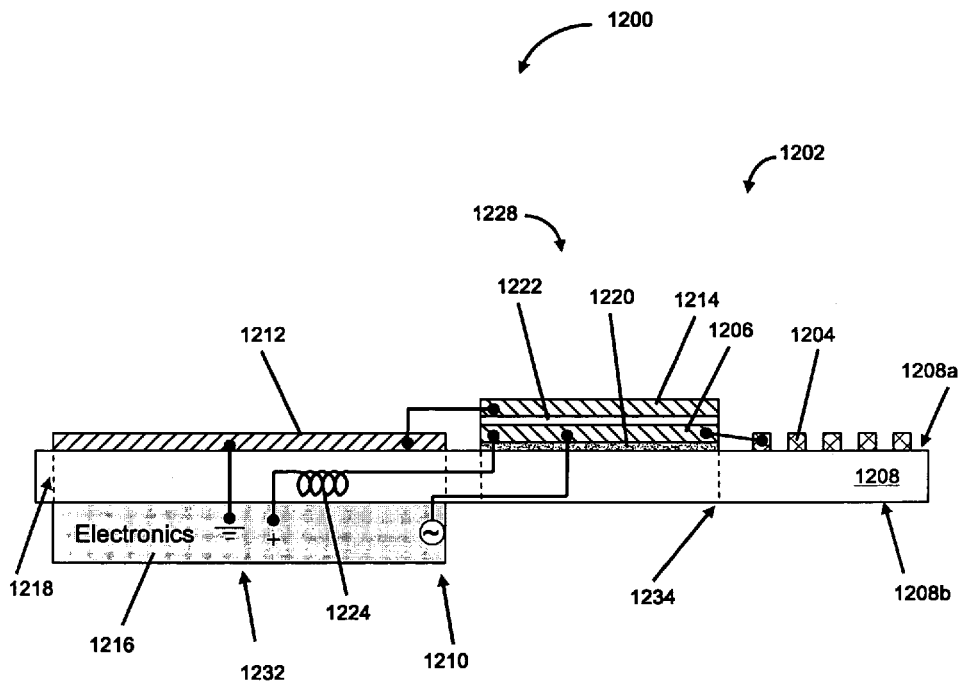
FIG. 12 is a schematic cross-sectional illustration of another embodiment of an antenna comprising a distributed strip and integrated battery, according to the present invention.

FIG. 12 is a schematic cross section view of another embodiment of an antenna 1200 comprising a distributed strip and integrated electronic components, according to the present invention. Antenna 1200 comprises a printed wiring board 1208 (i.e. a dielectric substrate) having a ground conductor 1212 (i.e. a ground plane) and a conductor 1204 patterned in a folded line configuration disposed on one side 1208*a* of the printed wiring board 1208. A battery 1228 is mounted on the printed wiring board 1208 by for example, an adhesive layer 1220. The battery 1228 comprises two poles (e.g. can be metallic foils) 1206 and 1214 separated by an electrolyte medium 1222. In this configuration, one of the poles 1206 is utilized as the distributed strip conductor within the radiating element 1202 of the antenna 1200. Pole 1206 is electrically connected to the conductor 1204 and signal generating circuit 1210, which can be contained within the electronics 1216, for driving the radiating element 1202. Both poles of the battery 1228 can be electrically connected 1232 to electronics 1216 thereby providing power to the electronics 1216 and signal generating circuit 1210. An RF choke or filter 1224 can be incorporated on one or more of the electrical interconnections as needed by an application, to prevent undesired coupling of energy radiated from the antenna, to for example, the electronics 1216.

The configuration shown in FIG. 12 can be useful, for example, in applications where the battery 1228 comprises a planar form factor having planar pole conductors. The electronics 1216 can be mounted on the opposed side 1208*b* of the printed wiring board 1208 and substantially within the extents 1218 of the ground plane conductor 1212. Additional electronic components can be mounted on the printed wiring board 1208, for example, on the surface 1208*b* and substantially within the extents 1234 of the pole 1206 of the battery 1228 being utilized as the distributed strip portion of the radiating element 1202. In an alternative embodiment, the battery can be mounted on the printed wiring board 1208 on a surface opposite the ground plane, for example, 1208*b*. As described above, mounting of electronics 1216 (e.g. electrical components) above or below the ground plane conductor 1212 or alternatively, above or below the pole 1206 comprising a distributed strip, is purely a matter of choice driven by the needs of a particular application.

The embodiments shown in FIGS. 9A through 12 illustrate exemplary configurations comprising radiating elements in proximity to ground conductors that can include ground planes. The present invention as well anticipates the use of radiating elements that can be arranged in a plurality of configurations, for example, as illustrated in FIGS. 1A through 8, including for example in FIG. 8, a configuration for an antenna commonly referred to as a dipole configuration.

The above described exemplary embodiments present several variants of the invention but do not limit the scope of the invention. Those skilled in the art will appreciate that the present invention can be implemented in other equivalent ways. The actual scope of the invention is intended to be defined in the following claims.

What is claimed is:

1. An antenna comprising:
   a dielectric substrate having a first surface and an opposed second surface;
   a first radiating element comprising, a first electrical conductor having a first width disposed on the first surface of the dielectric substrate, the first electrical conductor arranged in a folded line configuration; and, a second electrical conductor having a second width disposed on a surface of the dielectric substrate, the second width of the second electrical conductor greater than the first width of the first electrical conductor, the second electrical conductor electrically connected to the first electrical conductor, the second electrical conductor laterally separated from the first electrical conductor, the second electrical conductor arranged in a distributed strip configuration, the distributed strip configuration having outer extents; and, one or more electronic components mounted on at least one surface of the dielectric substrate, substantially within the outer extents of the distributed strip configuration.

2. The antenna of claim 1 wherein the one or more electronic components are selected from the group consisting of a battery, a resistor, a capacitor, an inductor, a transistor, a diode, an integrated circuit, a filter, a resonator, a solar cell, an electromagnetic induction pad and, a second radiating element.

3. The antenna of claim 2 wherein the first radiating element is operatively arranged to have a first resonant frequency and the second radiating element is operatively arranged to have a second resonant frequency.

4. The antenna of claim 3 wherein the first resonant frequency is equal to the second resonant frequency.

5. The antenna of claim 3 wherein the first resonant frequency is not equal to the second resonant frequency.

6. The antenna of claim 2 wherein the battery comprises one or more batteries selected from the group consisting of a lithium-ion battery, a nickel-cadmium battery, a prismatic battery, a thin-film battery, a cylindrical cell battery and a coin cell battery.

7. The antenna of claim 1 wherein the one or more electronic components are mounted on the at least one surface of the dielectric substrate by one or more mounts selected from the group consisting of an adhesive, a tape, a solder, an encapsulant, an over-mold and a clamp.

8. The antenna of claim 1 wherein the one or more electronic components are operatively arranged to provide an electrical signal to the radiating element of the antenna.

9. The antenna of claim 8 wherein the electrical signal comprises a frequency within the range from about 100 MHz to about 200 GHz.

10. The antenna of claim 1 wherein at least a portion of the antenna is encapsulated in a dielectric medium.

11. The antenna of claim 10 wherein the dielectric medium comprises one or more dielectric mediums selected from the group consisting of a polymer, a glass, a ceramic, a glass-ceramic and a composite material.

12. The antenna of claim 1 wherein the dielectric substrate comprises one or more dielectric substrates selected from the group consisting of a ceramic, a glass-ceramic, a low temperature co-fired ceramic, a polymer, a glass-polymer composite, a resin material, a fiber-reinforced composite, a printed wiring board composition, an epoxy-glass composite, an epoxy-polyimide composite, a polyamide, a fluoropolymer, a polyether ether ketone, a polydimethylsiloxane, a textile and, an insulated metal substrate.

13. The antenna of claim 1 wherein the folded line configuration comprises one or more conductors arranged in a pattern selected from the group consisting of a spiral, a serpentine, a meander, and a helix.

14. The antenna of claim 1 wherein the first radiating element comprises a resonant wavelength of $\lambda$ and, the first radiating element comprises a length $\leq \frac{1}{2}\lambda$.

15. The antenna of claim 14 wherein the length of the first radiating element is $\leq \frac{1}{4}\lambda$.

16. The antenna of claim 1 wherein the second width of the second electrical conductor is at least ten times greater than the first width of the first electrical conductor.

17. The antenna of claim 1 further comprising a ground conductor, the ground conductor laterally separated from and electrically coupled to, the radiating element comprising the first conductor and the second conductor.

18. The antenna of claim 17 wherein the ground conductor is disposed on at least one surface of the dielectric substrate.

19. The antenna of claim 18 wherein, the ground conductor comprises a ground plane configuration having outer extents and, further comprising one or more electrical components mounted on one or more surfaces of the dielectric substrate, substantially within the outer extents of the ground plane.

20. The antenna of claim 1 wherein the one or more electronic components comprises a battery and, the second electrical conductor comprises a pole of the battery.

21. The antenna of claim 1 comprising at least one radiating element configured as a dipole.

22. An antenna comprising:
a printed wiring board having a first surface and an opposed second surface;
a first radiating element disposed on the first surface of the printed wiring board, the first radiating element comprising,
a first electrical conductor having a first width, the first electrical conductor arranged in a folded line configuration; and,
a second electrical conductor having a second width, the second width of the second electrical conductor greater than the first width of the first electrical conductor, the second electrical conductor electrically connected to the first electrical conductor, the second electrical conductor arranged in a distributed strip configuration, the distributed strip configuration having first outer extents;
a ground conductor disposed on the first surface of the printed wiring board, the ground conductor laterally separated from the first and second electrical conductors, the ground conductor arranged in a ground plane configuration, the ground plane configuration having second outer extents;
at least one battery mounted on the second surface of the dielectric substrate, substantially within the first outer extents of the distributed strip configuration; and,
at least one electronic component mounted on the second surface of the dielectric substrate, substantially within the second outer extents of the ground plane configuration.

23. An antenna comprising:
a printed wiring board having a first surface and an opposed second surface;
a first radiating element disposed on the first surface of the printed wiring board, the first radiating element comprising,
a first electrical conductor having a first width, the first electrical conductor arranged in a folded line configuration; and,
a second electrical conductor having a second width, the second width of the second electrical conductor greater than the first width of the first electrical conductor, the second electrical conductor electrically connected to the first electrical conductor, the second electrical conductor arranged in a distributed strip configuration, the distributed strip configuration having first outer extents;

a ground conductor disposed on the first surface of the printed wiring board, the ground conductor laterally separated from the first and second electrical conductors, the ground conductor arranged in a ground plane configuration, the ground plane configuration having second outer extents; and, a battery mounted on the first surface of the dielectric substrate, a pole of the battery comprising the second electrical conductor.

24. The antenna of claim 23 comprising at least one electronic component mounted on a surface of the printed wiring board, substantially within one or more extents selected from the group consisting of the first outer extents and, the second outer extents.

* * * * *